(12) United States Patent
Collins et al.

(10) Patent No.: US 11,621,223 B2
(45) Date of Patent: Apr. 4, 2023

(54) INTERCONNECT HUB FOR DIES

(71) Applicant: Intel Corporation, Santa Clara, CA (US)

(72) Inventors: Andrew Collins, Chandler, AZ (US); Sujit Sharan, Chandler, AZ (US); Jianyong Xie, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 802 days.

(21) Appl. No.: 16/419,374

(22) Filed: May 22, 2019

(65) Prior Publication Data

US 2020/0373235 A1 Nov. 26, 2020

(51) Int. Cl.
| | | |
|---|---|---|
| *H01L 23/522* | (2006.01) | |
| *H01L 21/768* | (2006.01) | |
| *H01L 23/48* | (2006.01) | |
| *H01L 25/065* | (2006.01) | |
| *H01L 25/00* | (2006.01) | |

(52) U.S. Cl.
CPC .... *H01L 23/5226* (2013.01); *H01L 21/76898* (2013.01); *H01L 23/481* (2013.01); *H01L 25/0655* (2013.01); *H01L 25/50* (2013.01)

(58) Field of Classification Search
CPC ........... H01L 23/5226; H01L 21/76898; H01L 23/481; H01L 25/0655; H01L 25/50; H01L 2224/04105; H01L 2224/12105; H01L 23/538; H01L 23/5386; H01L 25/18; H01L 23/495; G06F 13/4068; G06F 13/4022
See application file for complete search history.

(56) References Cited

U.S. PATENT DOCUMENTS

| | | |
|---|---|---|
| 2006/0095639 A1 | 5/2006 | Guenin |
| 2016/0155729 A1 | 6/2016 | Fogal |
| 2018/0358313 A1 | 12/2018 | Newman |

FOREIGN PATENT DOCUMENTS

EP   3896576 A1 * 10/2021   ............. G06F 13/20

OTHER PUBLICATIONS

Search Report for European Patent Application No. 20166488.5, dated Sep. 25, 2020, 7 pages.
Office Action for European Patent Application No. 20166488.5 dated Aug. 9, 2022, 3 pages.

* cited by examiner

*Primary Examiner* — Douglas W Owens
(74) *Attorney, Agent, or Firm* — Schwabe, Williamson & Wyatt P.C.

(57) ABSTRACT

Embodiments herein relate to systems, apparatuses, or processes for an interconnect hub for dies that includes a first side and a second side opposite the first side to couple with three or more dies, where the second side includes a plurality of electrical couplings to electrically couple at least one of the three or more dies to another of the three or more dies to facilitate data transfer between at least a subset of the three or more dies. The three or more dies may be tiled dies.

20 Claims, 10 Drawing Sheets

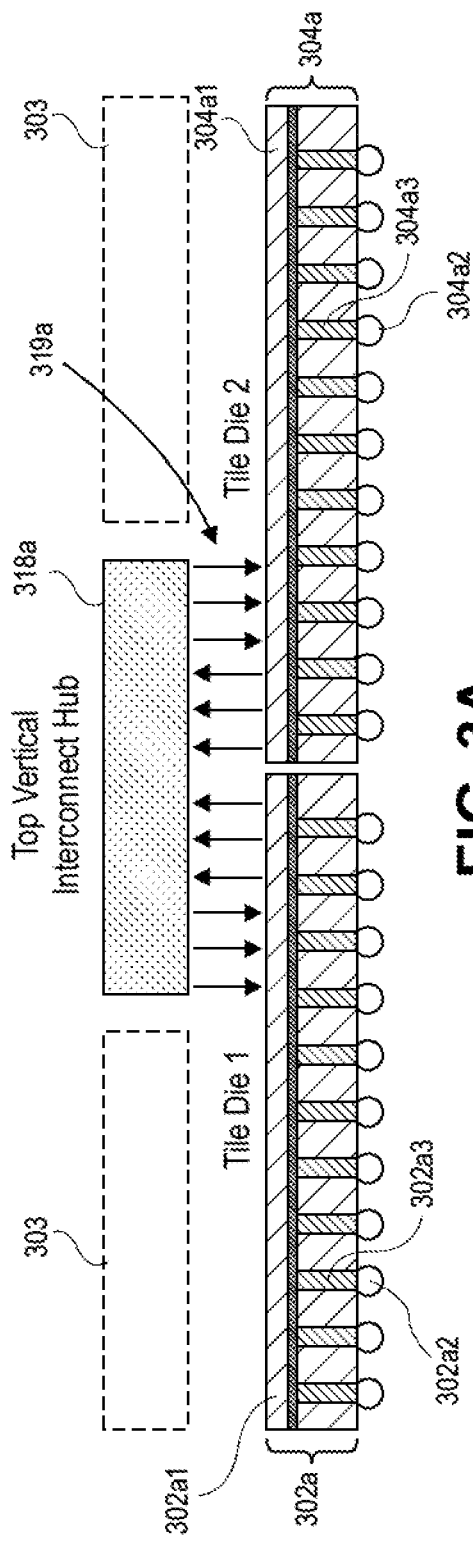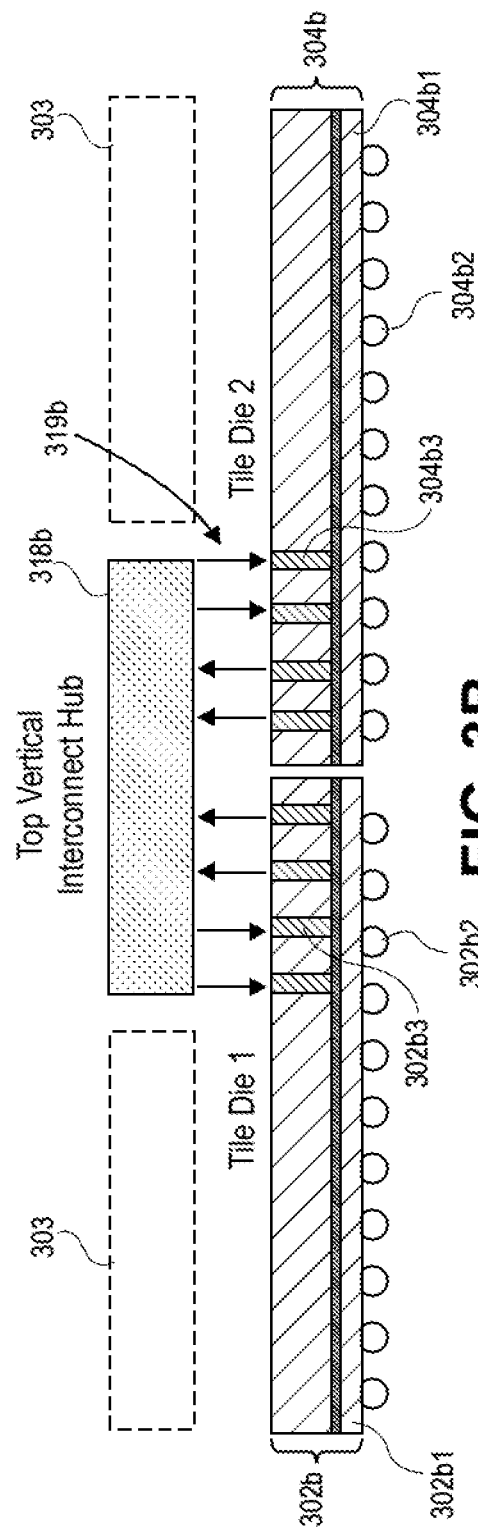

INTERCONNECT HUB FOR DIES

FIELD

Embodiments of the present disclosure generally relate to the field of package assemblies, and in particular package assemblies that include multiple dies that are interconnected.

BACKGROUND

Continued reduction in end product size of mobile electronic devices such as smart phones and ultrabooks is a driving force for the development of reduced size system in package components.

BRIEF DESCRIPTION OF THE DRAWINGS

FIGS. 3A-3C illustrates examples of attaching an interconnect hub to a plurality of dies, in accordance with embodiments.

DETAILED DESCRIPTION

Figure 1B:
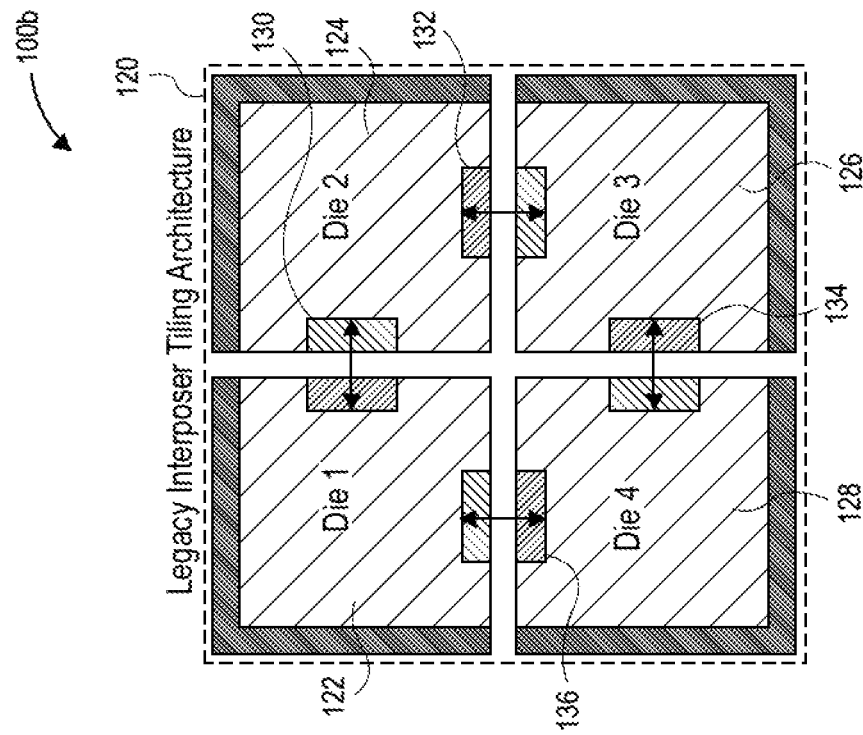
FIGS. 1A-1B illustrate an example of legacy implementations for providing high-speed connections between a plurality of dies, in accordance with embodiments.

Embodiments of the present disclosure may generally relate to systems, apparatus, and/or processes directed to an interconnect hub, which may also be referred to as a vertical interconnect hub, to provide connectivity to a plurality of tiled dies. In embodiments, the interconnect hub provides a high density die-to-die interconnect path for tiled die complexes.

In embodiments, the interconnect hub for tiled dies, which may be top mounted on the dies, provides a centralized interconnect implementation for adjacent and diagonal die-to-die, which may also be referred to as chip-to-chip, routing. This in turn provides more flexible and direct communication channels between dies that are in proximity to each other. Embodiments may reduce the number of die-to-die interconnects required for a tiled die complex. For example, legacy embedded bridge tiling implementations may utilize a bridge die (e.g. EMIB) for each die-to-die communication channel with no routing channels for direct communication between diagonally positioned surface mount dies. Other legacy implementations may use a silicon interposer that consists of a large silicon die base positioned under the full die tiling complex. Silicon interposer based solutions require the base die to be larger than the tiled die complex.

Legacy implementations, for example EMIB die-to-die conductivity, is limited to short, direct connections between two adjacent die on a shared embedded bridge. The limitations of legacy die-to-die communication within dies of the tiled die complex create IO overhead and latency when two nonadjacent dies need to communicate. Legacy silicon interposer-based die-to-die interconnects allows more flexibility for die-to-die connectivity than EMIB, but require a large interposer size that encompasses the entire tiled die complex. The large interposer size is limited by the maximum reticle size of that fabrication process (~800-900 m$^2$). Reticle stitching can be used to increase the effective maximum interposer size but this has limitations on connectivity across the stitch line and increases fabrication cost. Large interposers can be cost prohibitive due to poor wafer utilization and the larger area increasing the likelihood of defects. Another consideration is that very large silicon based die complexes are prone to higher warpage which can lead to a decrease in assembly yield.

Embodiments of techniques described herein may be useful for homogeneous die complexes with cell-like repeating tiles that through high bandwidth hub based interconnects can be networked together to act like one monolithic active die. In particular, this benefits products utilizing the leading edge process nodes where die yield on larger die sizes are a significant concern due to the immature die process technology. For example, graphics and/or artificial intelligence (AI) chip die complexes would benefit from scalable tile based die complexes where the key metric is die area based as opposed to package input/output (IO) counts.

Embodiments described herein may also address fabrication challenges with next generation silicon fabrication processes, including die complexes which use smaller active die tiles. First, having a single die-to-die port within the vertical hub solution could reduce die IO circuit area, power requirements and clocking overhead, by utilizing a single localized controller on each die as opposed to having multiple instances of the same chip to chip PHY. Embodiments may achieve direct die-to-die communication between the diagonal dies and thus reduces communication latency between the dies.

Second, when compared to EMIB, embodiments offer better pitch scaling due to the direct die-to-die interconnect and improved power delivery with current flow unencumbered by embedded bridge. Embodiments described herein may significantly reduce the number of interconnect structures between dies, which can increase die yields and reduce overall chip cost.

Third, embodiments may avoid high speed IO from the tiled dies having to pass through a passive interposer and/or through silicon vias (TSVs). This direct active die to package first level interconnect avoids the TSV pad capacitance and resistance impacts to signal loss and enables a more direct power delivery path to the tiled die.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the figures, and sizes, thicknesses, or dimensions may be assumed for some embodiments only where specifically indicated or discussed.

Figure 1A:
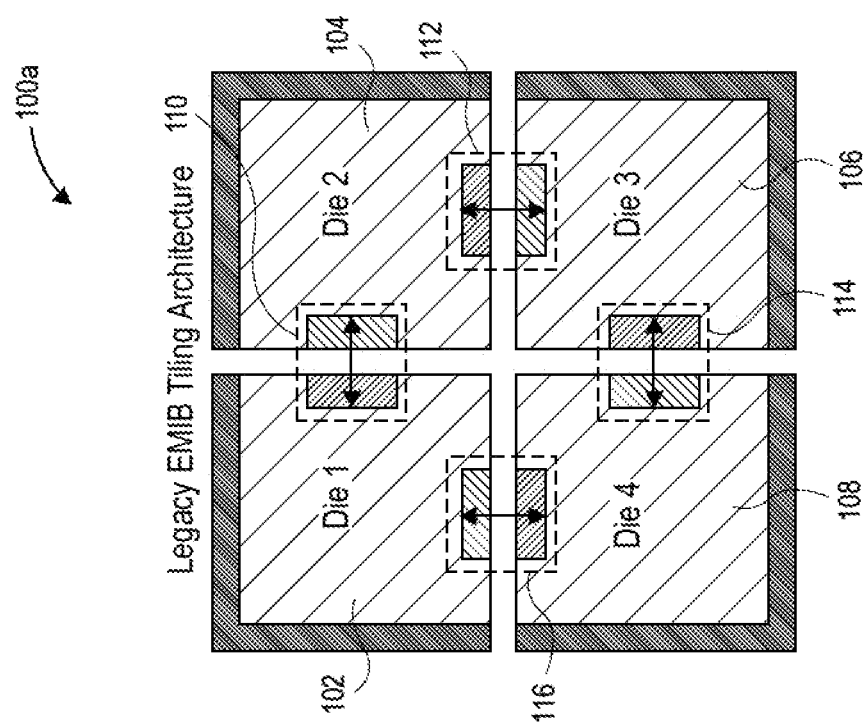

FIGS. 1A-1B illustrate an example of legacy implementations for providing high-speed connections between a plurality of dies, in accordance with embodiments. FIG. 1A shows package 100a of an example legacy implementation of four dies 102, 104, 106, 108 in a tiled formation that are coupled for high-speed data transfer using EMIBs 110, 112, 114, 116. A single EMIB 110 couples die 1 102 and die 2 104, but cannot be used to directly couple with any other die such as die 3 106 or die 4 108 respectively. A second EMIB 116 may be used to couple die 1 102 with die 4 108. However, in this implementation, die 1 102 has no direct communication path with die 3 106.

An EMIB 110, 112, 114, 116 may include a substrate with a small silicon based interconnect embedded into the organic substrate to connect a host chip (e.g. die 1 102) and a secondary chiplet (e.g. die 2 104) with a high bandwidth data path along the shared die edge.

FIG. 1B includes package 100b that shows an example legacy implementation using an interposer 120 used to couple the dies 122, 124, 126, 128. The interposer 120 may be a silicon interposer that serves as a large silicon die in place for routing purposes between the dies. In embodiments, the dies 122, 124, 126, 128 may be attached to one side of the interposer 120 and provide conductivity paths 130, 132, 134, 136 between the dies. The interposer 120 provides another high density architecture that uses a large passive silicon die positioned under the full die complex.

As shown, the conductivity paths 130, 132, 134, 136 do not provide a direct communication path between all of the dies. For example, die 1 122 does not have a direct communication path with die 3 126. As discussed above, using a legacy implementation of a silicon interposer 120 increase costs, and faced fabrication size limitation and assembly yield risks that come with larger base dies.

Figure 2:
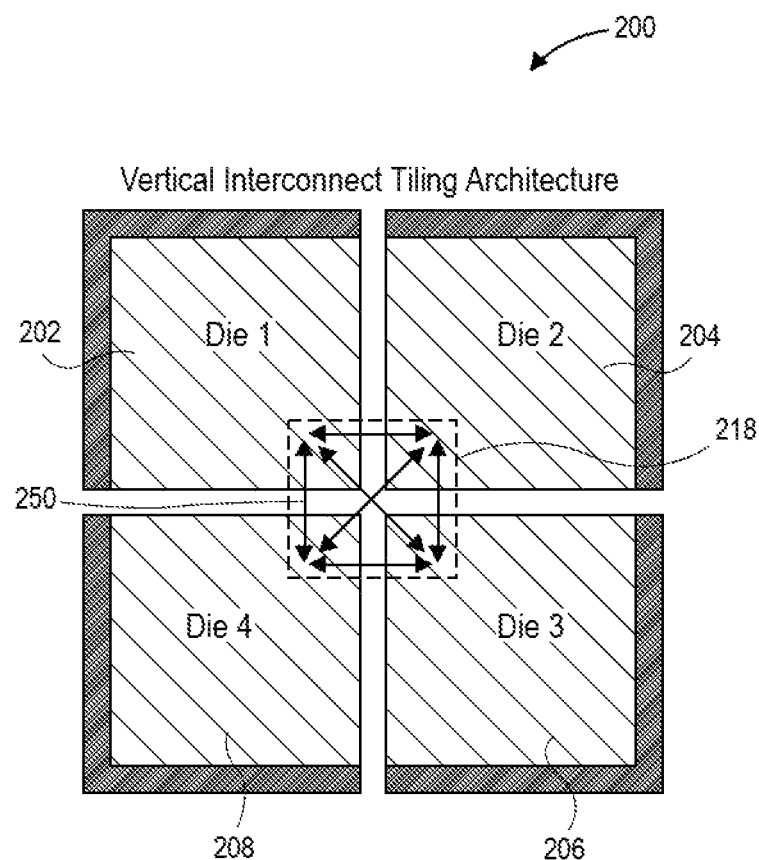
FIG. 2 illustrates an example of a top-down view of a package assembly using an interconnect hub to interconnect a plurality of dies, in accordance with embodiments.

FIG. 2 illustrates an example of a top-down view of a package assembly using an interconnect hub to interconnect a plurality of dies, in accordance with embodiments. FIG. 2 shows package 200 that includes four dies 202, 204, 206, 208 that are connected by a interconnect hub 218. In embodiments, the interconnect hub 218 overlaps a corner of each of the dies 202, 204, 206, 208 and physically and/or electrically couples with electronics of at least a subset of each of the dies.

This interconnect hub 218 may include a passive or an active silicon bridge that intersects a corner, respectively, of the four tiled surface mount dies 202, 204, 206, 208.

The die-to-die communication flow 250 shows possible communication paths that may be facilitated by the interconnect hub 218. In embodiments, each of the individual flows may be implemented by high-bandwidth, high-speed data connection that may exist in one or more layers within the interconnect hub 218. For example, using the interconnect hub 218 die 1 202 may communicate directly with die 2 204, die 3 206, and/or die 4 208.

In embodiments, each of the dies 202, 204, 206, 208 may be different types of dies, including dies from different manufacturers, that are communicatively coupled by the interconnect hub 218. In embodiments, the dies may be a same die that may have communications circuitry designed in a particular corner area of the die. When the dies 202, 204, 206, 208 are tiled, they may be positioned in a clockwise layout, where each die is rotated 90° such that the particular corner area having the communications circuitry is proximate to the other dies and may be electrically coupled with interconnect hub 218.

Figure 3C:
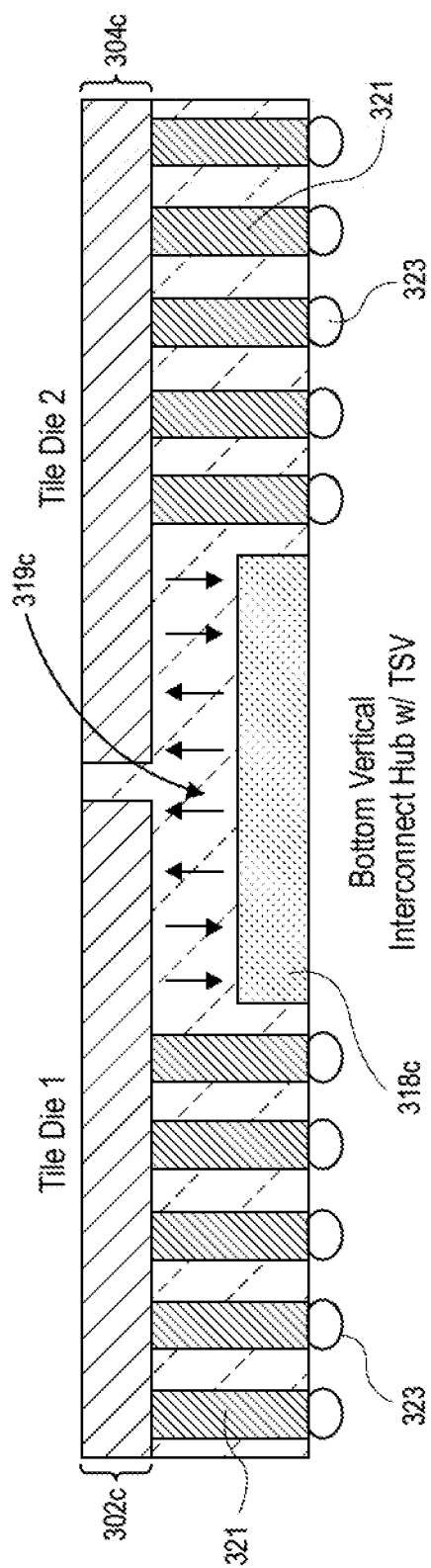

FIGS. 3A-3C illustrates examples of attaching an interconnect hub to a plurality of dies, in accordance with embodiments. Attachment embodiments may be configured in a different connectivity solutions. FIGS. 3A-3B show an example of configurations that position the interconnect hub mounted on top of the tiled dies. This allows for a direct tiled die to package connection for more direct power delivery and high speed IO routing. There are two variants with this architecture depending the performance requirements for die-to-die interconnections and signaling requirement for the tiling die going through a package substrate.

FIG. 3A shows tiled dies 302a and 304a, which may be similar to dies 202 and 204 of FIG. 2, that have their respective active circuitry 302a1, 304a1 facing upwards toward the interconnect hub 318a. When the dies 302a, 304a are connected to the interconnect hub 318a, data will transfer in the various paths 319a from the active circuitry 302a1 of the first die 302a through the interconnect hub 318a and to the active circuitry 304a1 of the second die 304a, and vice versa. The respective active circuitries of the dies 302a1, 304a1 may be coupled with respective ball grid arrays 302a2, 304a2, using through TSVs 302a3, 304a3 to provide an electrical connection with a substrate (not shown).

The embodiment implementation shown in FIG. 3A avoids inserting TSVs between respective active circuitry 302a1, 304a1 communication. These embodiments have die-to-die bandwidth and latency advantages. The 10 and power supplies that route out through the package must transition through TSVs 302a3, 304a3 which can potentially have higher power delivery loop inductance, increase high speed signaling loss and generate higher cross talk for signals going through the package.

FIG. 3B shows tiled dies 302b and 304b, which may be similar to dies 202 and 204 of FIG. 2, that have their respective active circuitry 302b1, 304b1 facing downward away from the interconnect hub 318b. When the dies 302b, 304b are connected to the interconnect hub 318b, data will transfer in the various paths 319b from the active circuitry 302b1, 304b1 of the dies 302b, 304b through the interconnect hub 318b using vias 302b3, 304b3. The respective active circuitries of the dies 302b1, 304b1 may be coupled with respective ball grid arrays 302b2, 304b2 to provide an electrical connection with a substrate (not shown).

The embodiment of FIG. 3B only utilizes TSVs for the die-to-die interconnect, so all other IO and power delivery on the active circuitry 302b1, 304b1 can avoid TSVs. For improved mechanical reliability and better heat dissipation, "dummy" dies 303 can be added on top of the active tile dies 302b, 304b to make a uniform top for the die complex. These "dummy" dies 303 create a direct silicon based path for heat dissipation from the base tile to thermal solution above. Mechanically, the die complex would benefit from having a more uniform rectangular cross-section with smaller stress singularities. The "dummy" die 303 can be passive silicon with no metal features or passive silicon with simple passive metal features such as capacitors and/or inductors with a direct die to die interconnect to the base tile. The dummy tile can also be active silicon with additional logic circuitry or memory such as SRAM.

FIG. 3C shows a side view of an interconnect hub 318c, which may be similar to interconnect hub 218 of FIG. 2. The interconnect hub 318c is in position between the tiled dies 302c, 304c and the substrate (not shown). Copper pillars 321 may connect the respective dies 302c, 304c to a ball grid array 323 that made the physically coupled to the substrate (not shown). In this configuration, die-to-die connectivity 319c may be achieved without requiring TSVs in the interconnect hub 318c or the dies 302c, 304c. In addition, this configuration will provide a uniform top die plane from the dies 302c, 304c to a thermal solution without the need for "dummy" die 303. The interconnect hub 318c standoff may create a vertical gap between the tiled die bumps and the package first level interconnect which can be closed by using copper pillars 321 or by using another high density, for example 10-200 μm pitch, vertical conductivity implementation.

Figure 4:
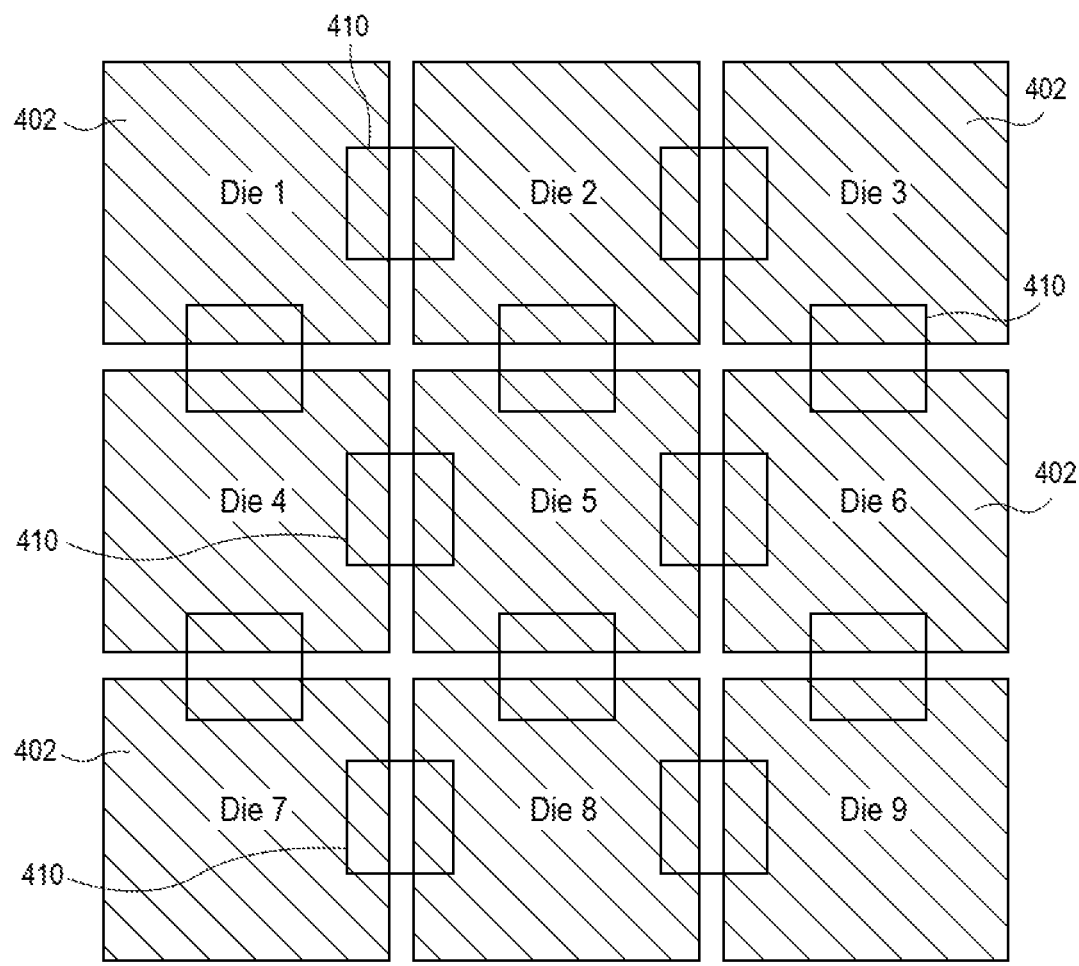
FIG. 4 illustrates an example of a legacy implementation for interconnecting a 3×3 die tile using Embedded Multi-die Interconnect Bridge (EMIB) structures.

FIG. 4 illustrates an example of a legacy implementation for interconnecting a 3×3 die tile using EMIB structures. As shown, dies 402, which may be similar to die 102 of FIG. 1, are tiled in a 3×3 pattern and are interconnected in a legacy implementation by 12 EMIBs 410 dies. As shown in and as discussed with respect to FIG. 1A, an EMIB 410 may only directly connect a die 410 with another die that is immediately above, below, left, or right of the die 410. Thus, a larger number of EMIB 410 structures are needed to achieve less die 402 interconnectivity as compared to embodiments described herein.

Figure 5:
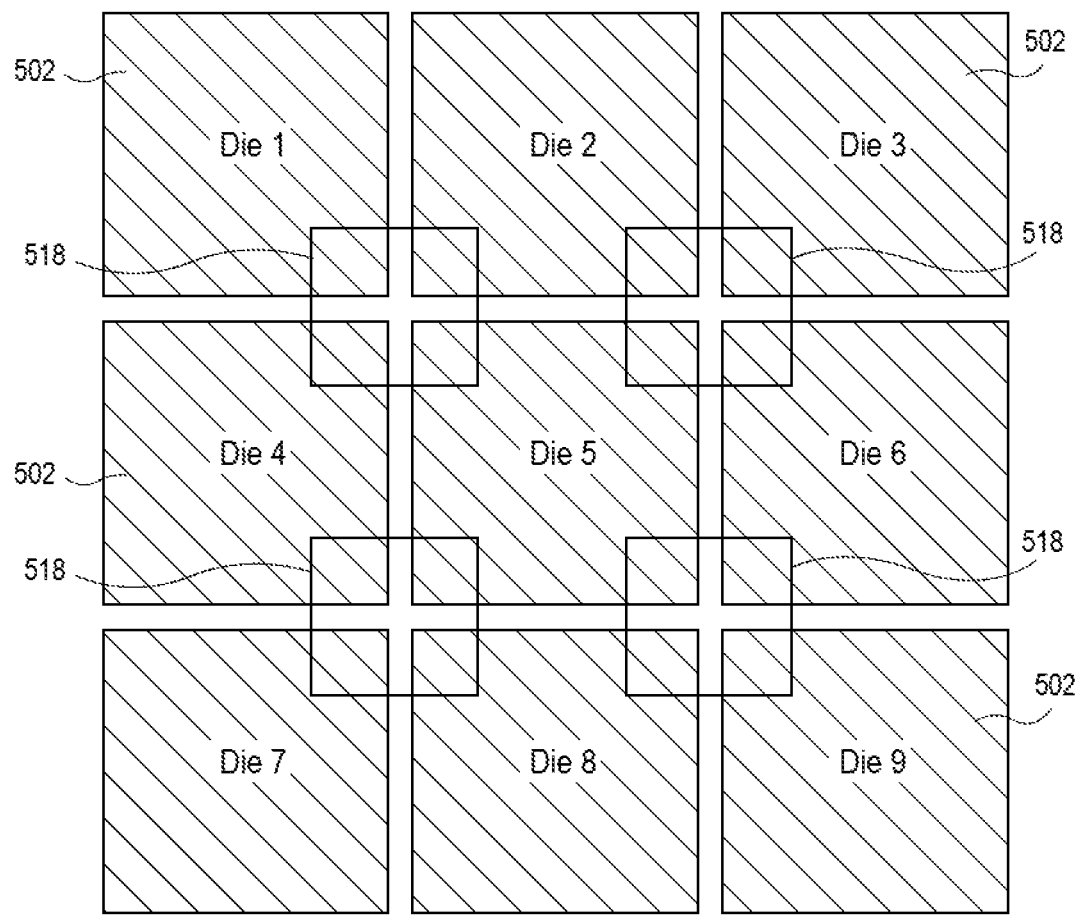
FIG. 5 illustrates an example of a four vertical interconnect hub architecture for interconnecting a 3×3 die tile, in accordance with embodiments.

FIG. 5 illustrates an example of a four vertical interconnect hub architecture for interconnecting a 3×3 die tile, in accordance with embodiments. Dies 502, which may be similar to die 202 of FIG. 2, are tiled in a 3×3 pattern and are interconnected using interconnect hubs 518, which may be similar to interconnect hub 218 of FIG. 2. As shown, only four interconnect hubs 518 are used, and yet this technique provides greater interconnect coverage than the 12 EMIB dies 410 shown for a similar die tiling pattern in FIG. 4.

Figure 6:
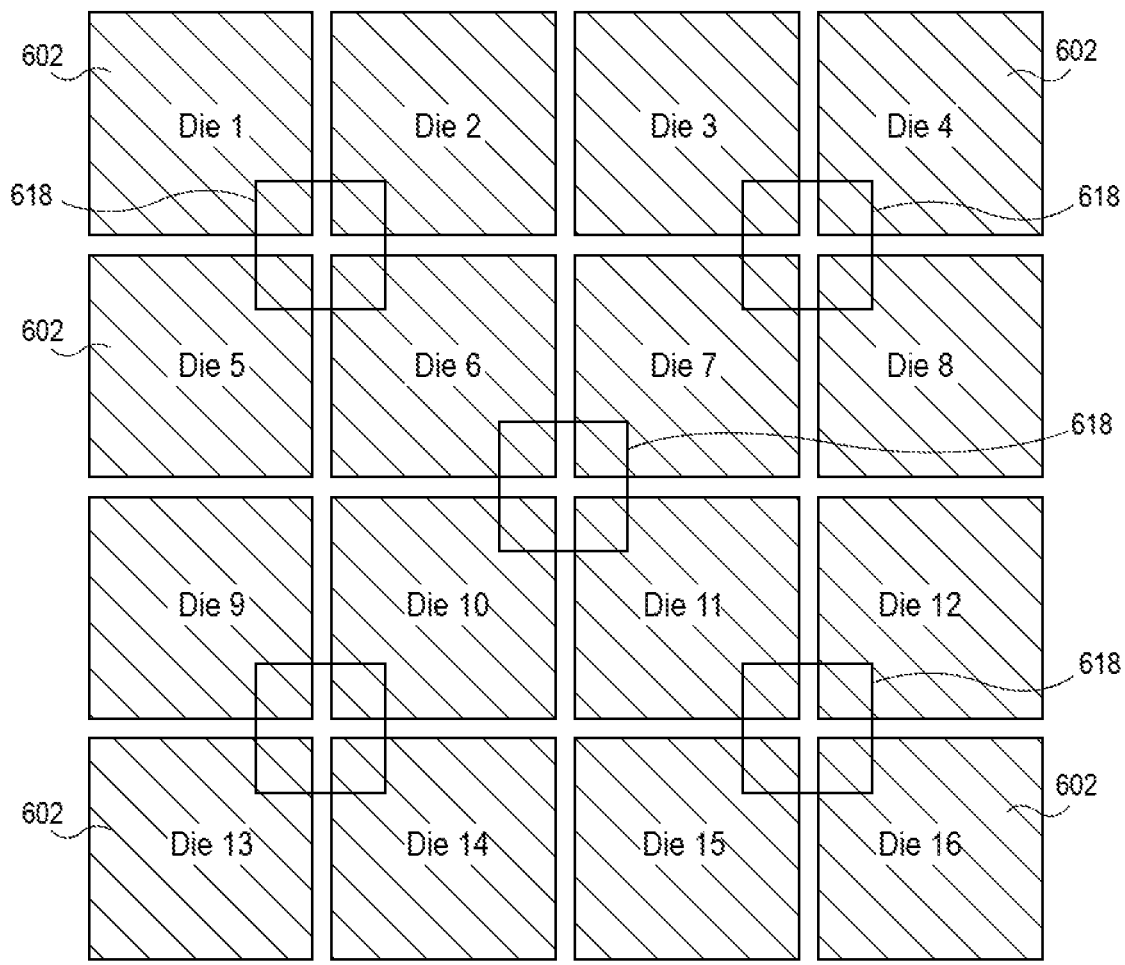
FIG. 6 illustrates an example of a five vertical interconnect hub architecture for interconnecting a 4×4 die tile, in accordance with embodiments.

The tiling and interconnect hub architecture shown in FIG. 5 may be extended hierarchically for larger tile complexes while reducing inter-die area overhead, using fewer connections, and increasing bandwidth between connected dies 502. For example, FIG. 6 illustrates an example of a five interconnect hub architecture for interconnecting a 4×4 die tile, in accordance with embodiments. The tiled dies 602 may be coupled using five interconnect hubs 618, which may be similar to interconnect hubs 518 of FIG. 5.

Figure 7:
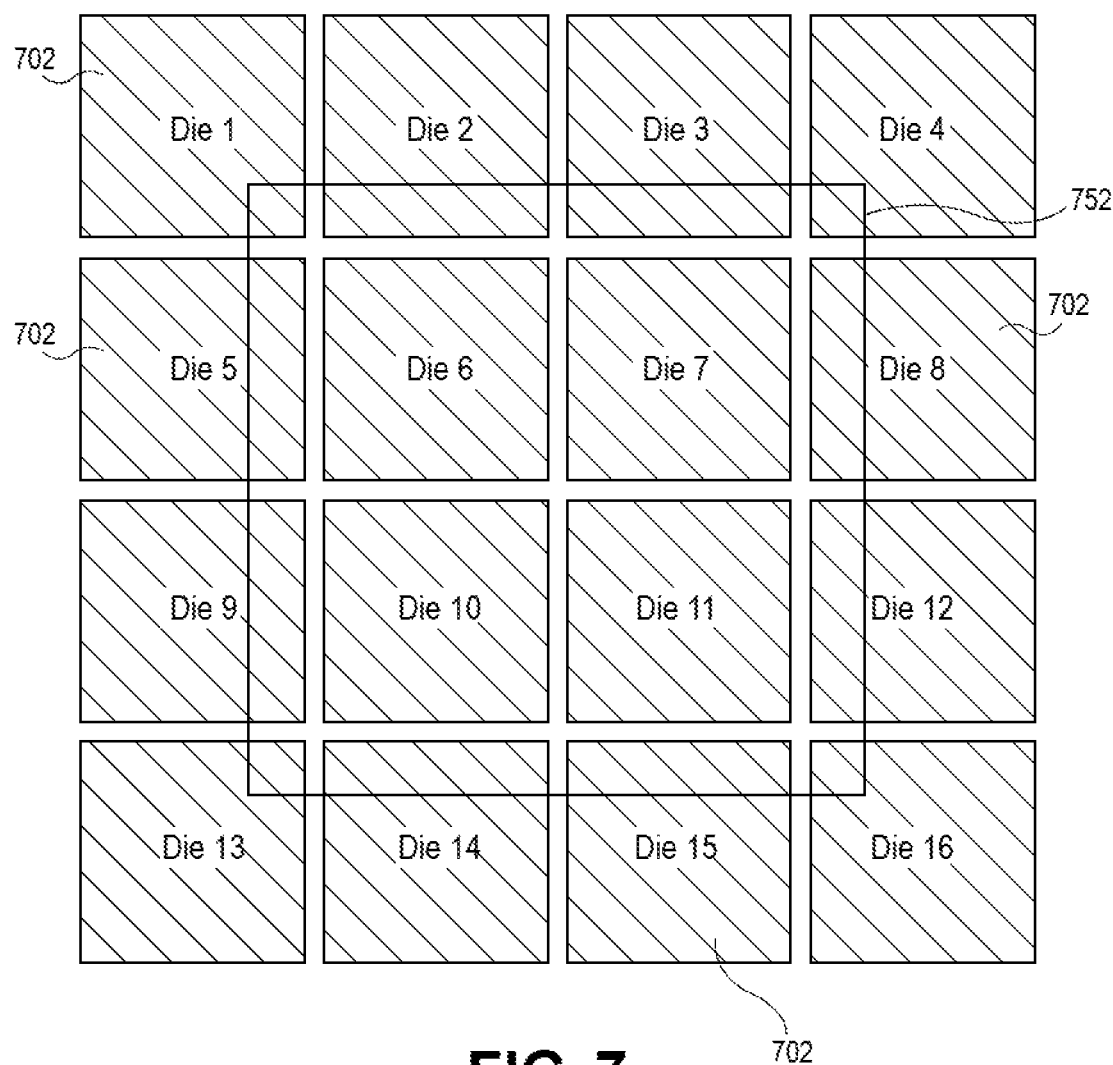
FIG. 7 illustrates an example of a vertical interconnect hub for interconnecting a 4×4 die tile, in accordance with embodiments.

FIG. 7 illustrates an example of a vertical interconnect hub for interconnecting a 4×4 die tile, in accordance with embodiments. Dies 702, which may be similar to die 202 of FIG. 2, are tiled in a 4×4 pattern. Instead of using five smaller hub bridges 618 as shown in FIG. 6, where die to die conductivity is limited to four tiles per hub, FIG. 7 shows an architecture of one large hub 752 that intersects and interconnects all of the base tiled dies 702.

Figure 8:
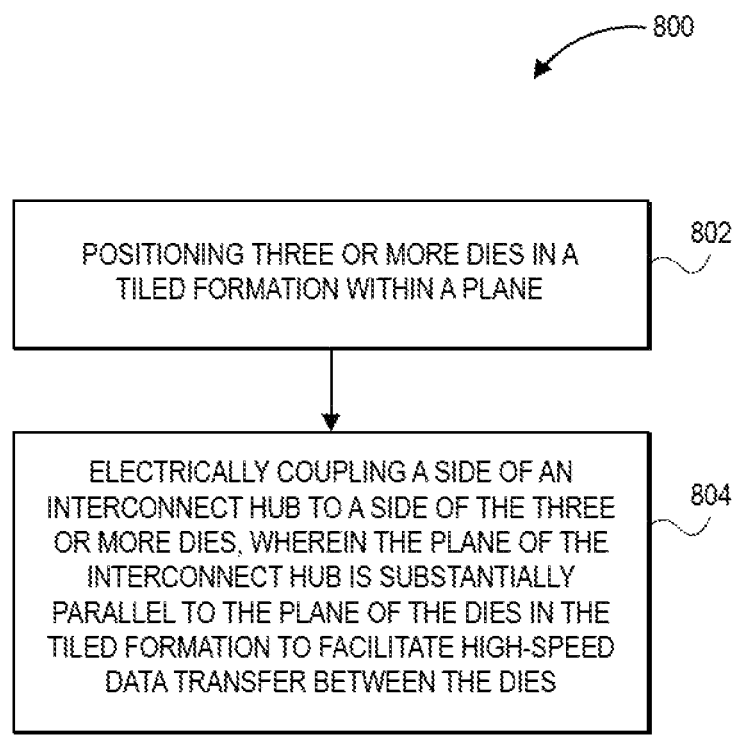
FIG. 8 illustrates an example of a process for using a vertical interconnect hub to interconnect three or more dies in a tiled formation, in accordance with embodiments.

FIG. 8 illustrates an example of a process for using a vertical interconnect hub to interconnect three or more dies in a tiled formation, in accordance with embodiments. In embodiments, the process elements described in association with FIGS. 2, 3A-3C, and 4-7.

At block 802, the process may include positioning three or more dies in a tiled formation within a plane. In embodiments, the three or more dies may correspond to tiled dies 202, 204, 206, 208 of FIG. 2, dies 302a, 304a, 302b, 304b, 302c, 304c of FIGS. 3A-3C, tiled dies 502 of FIG. 5, tiled dies 602 of FIG. 6, and tiled dies 702 of FIG. 7.

At block 804, the process may include electrically coupling a side of an interconnect hub to a side of the three or more dies, wherein the plane of the interconnect hub is substantially parallel to the plane of the dies in the tiled formation to facilitate high-speed data transfer between the dies. In embodiments, the interconnect hub may correspond to interconnect hub 218 of FIG. 2, interconnect hub 318a, 318b, 318c of FIGS. 3A-3C, interconnect hubs 518 of FIG. 5, and interconnect hubs 618 of FIG. 6.

Figure 9:
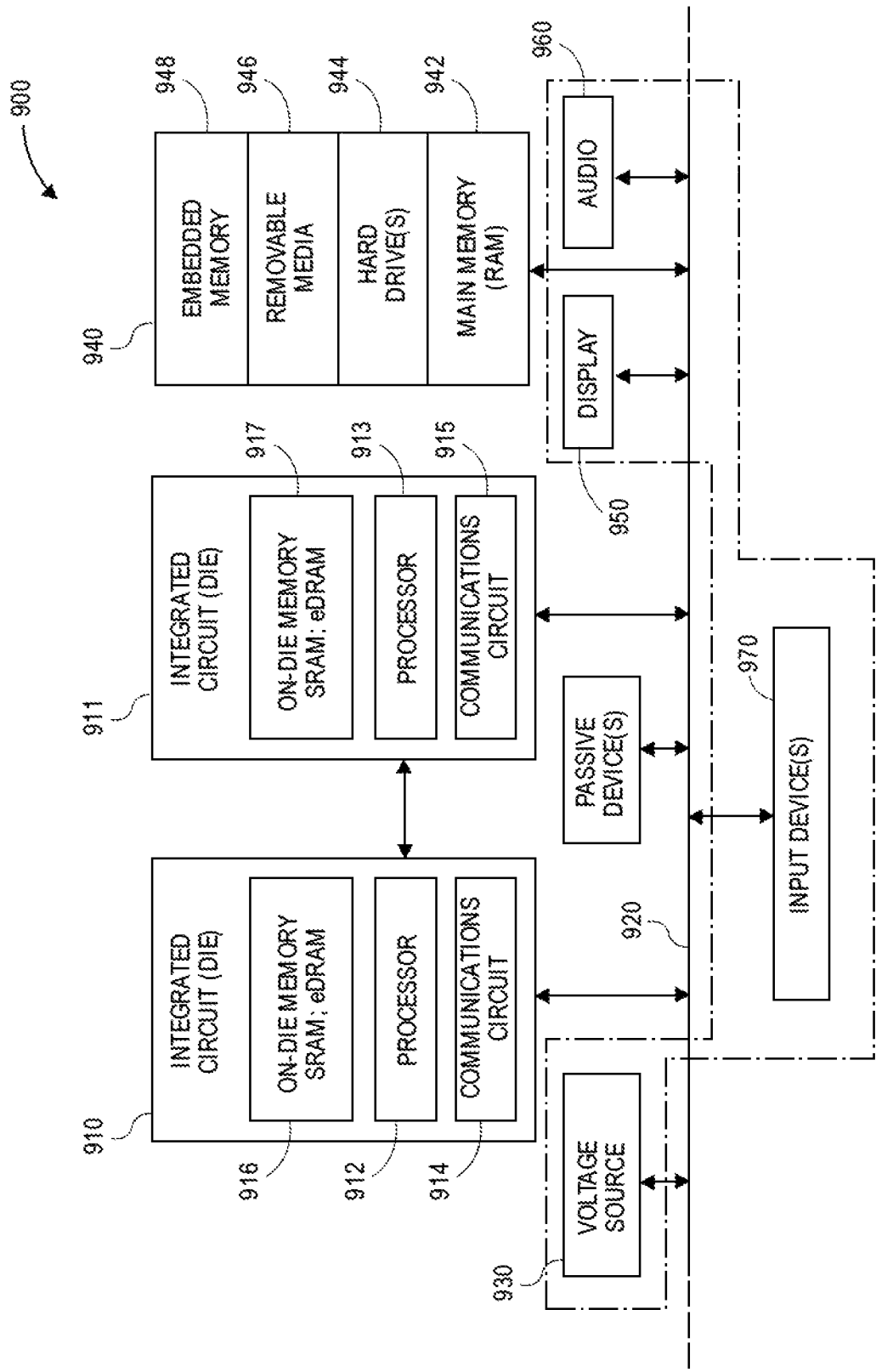
FIG. 9 schematically illustrates a computing device, in accordance with embodiments.

FIG. 9 schematically illustrates a computing device, in accordance with embodiments. The computer system 900 (also referred to as the electronic system 900) as depicted can embody an interconnect hub for dies, according to any of the several disclosed embodiments and their equivalents as set forth in this disclosure. The computer system 900 may be a mobile device such as a netbook computer. The computer system 900 may be a mobile device such as a wireless smart phone. The computer system 900 may be a desktop computer. The computer system 900 may be a hand-held reader. The computer system 900 may be a server system. The computer system 900 may be a supercomputer or high-performance computing system.

In an embodiment, the electronic system 900 is a computer system that includes a system bus 920 to electrically couple the various components of the electronic system 900. The system bus 920 is a single bus or any combination of busses according to various embodiments. The electronic system 900 includes a voltage source 930 that provides power to the integrated circuit 910. In some embodiments, the voltage source 930 supplies current to the integrated circuit 910 through the system bus 920.

The integrated circuit 910 is electrically coupled to the system bus 920 and includes any circuit, or combination of circuits according to an embodiment. In an embodiment, the integrated circuit 910 includes a processor 912 that can be of any type. As used herein, the processor 912 may mean any type of circuit such as, but not limited to, a microprocessor, a microcontroller, a graphics processor, a digital signal processor, or another processor. In an embodiment, the processor 912 includes, or is coupled with, an interconnect hub for dies, as disclosed herein. In an embodiment, SRAM embodiments are found in memory caches of the processor. Other types of circuits that can be included in the integrated circuit 910 are a custom circuit or an application-specific integrated circuit (ASIC), such as a communications circuit 914 for use in wireless devices such as cellular telephones, smart phones, pagers, portable computers, two-way radios, and similar electronic systems, or a communications circuit for servers. In an embodiment, the integrated circuit 910 includes on-die memory 916 such as static random-access memory (SRAM). In an embodiment, the integrated circuit 910 includes embedded on-die memory 916 such as embedded dynamic random-access memory (eDRAM).

In an embodiment, the integrated circuit 910 is complemented with a subsequent integrated circuit 911. Useful embodiments include a dual processor 913 and a dual communications circuit 915 and dual on-die memory 917 such as SRAM. In an embodiment, the dual integrated circuit 910 includes embedded on-die memory 917 such as eDRAM.

In an embodiment, the electronic system 900 also includes an external memory 940 that in turn may include one or more memory elements suitable to the particular application, such as a main memory 942 in the form of RAM, one or more hard drives 944, and/or one or more drives that handle removable media 946, such as diskettes, compact disks (CDs), digital variable disks (DVDs), flash memory drives, and other removable media known in the art. The external memory 940 may also be embedded memory 948 such as the first die in a die stack, according to an embodiment.

In an embodiment, the electronic system 900 also includes a display device 950, an audio output 960. In an embodiment, the electronic system 900 includes an input device such as a controller 970 that may be a keyboard, mouse, trackball, game controller, microphone, voice-recognition device, or any other input device that inputs information into the electronic system 900. In an embodiment, an input device 970 is a camera. In an embodiment, an input device 970 is a digital sound recorder. In an embodiment, an input device 970 is a camera and a digital sound recorder.

As shown herein, the integrated circuit 910 can be implemented in a number of different embodiments, including a package substrate having an interconnect hub for dies, according to any of the several disclosed embodiments and their equivalents, an electronic system, a computer system, one or more methods of fabricating an integrated circuit, and one or more methods of fabricating an electronic assembly that includes a package substrate having an interconnect hub for dies, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having an interconnect hub for dies embodiments and their equivalents. A foundation substrate may be included, as represented by the dashed line of FIG. 9. Passive devices may also be included, as is also depicted in FIG. 9.

EXAMPLES

Example 1 is an interconnect hub comprising: a first side; a second side opposite the first side to couple with three or more dies, and wherein the second side includes a plurality of electrical couplings to electrically couple at least one of the three or more dies to another of the three or more dies; and wherein the electrical couplings are to facilitate data transfer between at least a subset of the three or more dies.

Example 2 may include the interconnect hub of example 1, wherein the second side is to physically couple with the three or more dies.

Example 3 may include the interconnect hub of example 1, wherein a corner of the second side of the interconnect hub is to physically couple with a corner of one of the three or more dies.

Example 4 may include the interconnect hub of example 1, wherein the three or more dies are tiled dies.

Example 5 may include the interconnect hub of example 1, wherein a subset of the plurality of electrical couplings are coupled with routing channels to facilitate direct communication between a first of the three or more dies and a second of the three or more dies.

Example 6 may include the interconnect hub of example 1, wherein the interconnect hub is a silicon bridge or interposer.

Example 7 may include the interconnect hub of example 1, wherein the three or more dies are a same die rotated 90, 180, or 270 degrees.

Example 8 may include the interconnect hub of example 1, wherein the interconnect hub includes at least one active component or at least one passive component.

Example 9 may include the interconnect hub of any one of examples 1-8, wherein data transfer includes high-speed TO data transfer.

Example 10 is a system comprising: three or more dies; an interconnect hub physically coupled to the three or more dies that includes: a first side; a second side opposite the first side to couple with the three or more dies, and wherein the second side includes a plurality of electrical couplings to electrically couple at least one of the three or more dies to another of the three or more dies; and wherein the electrical couplings are to facilitate high-speed data transfer between at least a subset of the three or more dies.

Example 11 may include the system of example 10, wherein a corner of the second side of the interconnect hub is to physically couple with a corner of the three or more dies.

Example 12 may include the system of example 11, wherein the three or more dies are tiled dies.

Example 13 may include the system of example 10, wherein a subset of the plurality of electrical couplings are coupled with routing channels to facilitate direct communication between a first of the three or more dies and a second of the three or more dies.

Example 14 may include the system of example 10, wherein the three or more dies are a same die rotated 90, 180, or 270 degrees.

Example 15 may include the system of example 10, wherein the interconnect hub includes at least one active component or at least one passive component.

Example 16 may include the system of example 10, wherein the second side of the interconnect hub is directly coupled with an active side of the three or more dies.

Example 17 may include the system of any one of examples 10-16, wherein data transfer includes high-speed TO data transfer.

Example 18 is a method comprising: positioning three or more dies in a tiled formation within a plane; and electrically coupling a side of an interconnect hub to a side of the three or more dies, wherein the plane of the interconnect hub is substantially parallel to the plane of the dies in the tiled formation to facilitate high-speed data transfer between the dies.

Example 19 may include the method of example 18, wherein electrically coupling further includes physical coupling to a corner of each of the three or more dies.

Example 20 may include the method of any one of examples 18-19, wherein electrically coupling the side of the interconnect hub to a side of the three or more dies further includes electrically coupling the side of the interconnect hub to an active side of the three or more dies.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. An interconnect hub comprising:
a first side;
a second side opposite the first side, wherein the second side is electrically and physically coupled with four or more dies, wherein the four or more dies are substantially in a plane, wherein the second side overlaps at least a portion of a top surface of each of the four or more dies; and
wherein the interconnect hub includes two or more electrically conductive layers that are electrically isolated from each other and that electrically couple at least some of the four or more dies with each other.

2. The interconnect hub of claim 1, wherein the four or more dies include a fifth die, and wherein the second side fully covers a top of the fifth die.

3. The interconnect hub of claim 2, wherein the interconnect hub is electrically coupled with the fifth die.

4. The interconnect hub of claim 1, wherein at least two of the four or more dies are identical dies.

5. The interconnect hub of claim 4, wherein the at least two of the four or more identical dies are rotated 90, 180, or 270 degrees.

6. The interconnect hub of claim 1, wherein the interconnect hub is a silicon bridge or an interposer.

7. The interconnect hub of claim 1, wherein the at least a portion of the top surface of each of the four or more dies includes a corner of the top surface of each of the four or more dies.

8. The interconnect hub of claim 1, wherein the interconnect hub includes at least one active component or at least one passive component.

9. The interconnect hub of claim 1, wherein the two or more electrically conductive layers conduct power and IO data.

10. A system comprising:
four or more dies;
an interconnect hub physically coupled to a top of the four or more dies, the interconnect hub includes:
a first side;
a second side opposite the first side, wherein the second side includes a plurality of electrical couplings that electrically couple at least one of the four or more dies to another of the four or more dies; and
wherein the second side completely covers a top of at least one of the four or more dies.

11. The system of claim 10, wherein the four or more dies are tiled dies.

12. The system of claim 10, wherein at least two of the four or more dies are identical dies.

13. The system of claim 12, wherein the at least two of the four or more identical dies are rotated 90, 180, or 270 degrees.

14. The system of claim 10, wherein the interconnect hub includes at least one active component or at least one passive component.

15. The system of claim 10, wherein the second side of the interconnect hub is directly coupled with an active side of the four or more dies.

16. The system of claim 10, wherein the interconnect hub includes two or more electrically conductive layers that are electrically isolated from each other and that electrically couple at least some of the four or more dies with each other.

17. The system of claim 13, wherein the second side of the interconnect hub overlaps a portion of each of the at least two of the four or more identical dies, and wherein each overlapped portion of the at least two of the four or more identical dies is an identical portion.

18. A method comprising:
positioning five or more dies in a tiled formation within a plane; and
electrically and physically coupling a side of an interconnect hub to a top of the five or more dies, wherein a plane of the side of the interconnect hub is substantially parallel to the plane of the dies in the tiled formation, and wherein the side of the interconnect hub completely covers the top of at least one of the five or more dies.

19. The method of claim 18, wherein electrically coupling further includes directly electrically coupling.

20. The method of claim 19, wherein electrically coupling the side of the interconnect hub to the top of the five or more dies further includes electrically coupling the side of the interconnect hub to an active side of the five or more dies, wherein the active side of each of the five or more dies is proximate to the top of the five or more dies.

\* \* \* \* \*